United States Patent
Melanson

(10) Patent No.: US 7,183,957 B1
(45) Date of Patent: Feb. 27, 2007

(54) SIGNAL PROCESSING SYSTEM WITH ANALOG-TO-DIGITAL CONVERTER USING DELTA-SIGMA MODULATION HAVING AN INTERNAL STABILIZER LOOP

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/323,671

(22) Filed: Dec. 30, 2005

(51) Int. Cl.
*H03M 3/00* (2006.01)

(52) U.S. Cl. .................... 341/143; 341/155

(58) Field of Classification Search ......... 341/130–170
See application file for complete search history.

(56) References Cited

U.S. PATENT DOCUMENTS

| | | | |
|---|---|---|---|
| 5,815,102 A | 9/1998 | Melanson | 341/143 |
| 6,150,969 A | 11/2000 | Melanson | 341/143 |
| 6,727,832 B1 | 4/2004 | Melanson | 341/143 |
| 6,842,486 B2 * | 1/2005 | Plisch et al. | 341/143 |
| 6,961,385 B2 * | 11/2005 | Plisch et al. | 327/124 |
| 7,084,798 B2 * | 8/2006 | Melanson | 341/143 |

* cited by examiner

*Primary Examiner*—Rexford Barnie
*Assistant Examiner*—Lam T. Mai
(74) *Attorney, Agent, or Firm*—Hamilton & Terrile, LLP; Kent B. Chambers

(57) ABSTRACT

A signal processing system includes an analog-to-digital delta sigma modulator with a duty cycle modulator and a finite impulse response (FIR) filter in a main loop feedback path of the delta sigma modulator. The duty cycle modulator and FIR filter can provide high performance filtering in the main loop feedback path. To prevent instability in the main loop caused by the duty cycle modulator and FIR filter, the delta sigma modulator also includes a stabilizer loop. Transfer functions of the main loop and the stabilizer loop combine to achieve a target transfer function for the analog-to-digital delta sigma modulator that provides for stable operation of the analog-to-digital delta sigma modulator.

21 Claims, 9 Drawing Sheets

SIGNAL PROCESSING SYSTEM WITH ANALOG-TO-DIGITAL CONVERTER USING DELTA-SIGMA MODULATION HAVING AN INTERNAL STABILIZER LOOP

BACKGROUND OF THE INVENTION

1. Field of the Invention

The present invention relates in general to the field of information processing, and more specifically to a system and method for stabilizing an analog-to-digital converter delta sigma modulator.

2. Description of the Related Art

Many electronic systems employ signal processing technology to process analog, digital, or a mix of analog and digital signals. In audio applications, an analog-to-digital conversion process often involves oversampling a signal, modulating the signal using a delta-sigma modulator to shape noise associated with quantizing the signal, and filtering the delta sigma modulator output with a digital filter. The filtered output signal used in a variety of ways, such as stored as digital data, transmitted, or used to subsequently produce an analog signal suitable for driving a load such as a speaker.

Delta-sigma modulators receive an input signal and convert the signal into a series of low resolution pulses having an average amplitude over time proportional to the input signal. In the process of producing a modulated output signal, delta-sigma modulators introduce quantization noise into the modulated input signal. However, the quantization noise advantageously resides outside of the audio baseband where frequency components of interest reside, i.e. between about 0 Hz and above about 20–25 kHz. Thus, in an audio context, "in-band" refers to frequencies between 0 Hz and about 20–25 kHz, and out-of-band frequencies refer to frequencies above the maximum in-band frequency. "Delta-sigma modulators" are also commonly referred to using other interchangeable terms such as "sigma-delta modulators", "delta-sigma converters", "sigma delta converters", "data converters", "noise shapers", as well as full and partial combinations of the foregoing terms.

FIG. 1 depicts a conventional topology of an analog-to-digital converter (ADC) 100 that converts input signal, $V_{in}$, into a digital output signal, D. The quantizer 108 of ADC delta sigma modulator 101 quantizes the output signal L(z) of loop filter 106 to generate an M-bit quantizer output signal Y corresponding to. "M" is an integer greater than zero and represents the number of bits used by quantizer 108 to quantize the output signal L(z) of loop filter 106 The ADC delta sigma modulator 100 represents output signal Y as a series of low resolution pulses whose average value over time represents delta sigma modulator input signal $V_{in}$. In a one-bit delta sigma modulator, the quantizer 108 quantizes the output signal of filter 106 as either a logical +1 or −1, and multi-bit quantizers use multiple bits to quantize the output signal of filter 106. The delta sigma modulator 100 includes an adder 102 to add the input signal $V_{in}$ to a negative of an analog feedback signal, $V_{fb}$. Delta sigma modulator 100 includes a delay element represented by $z^{-1}$ in a feedback loop to feed back output signal $Y \cdot z^{-1}$ (Y(n−1) in the time domain) to DAC 104. The analog feedback signal $V_{fb}$ represents the output of a digital-to-analog converter (DAC) 104. The summer 102 adds $V_{in}$ and ($-V_{fb}$) to determine a difference signal, $V_{diff}$, i.e. $V_{diff}=V_{in}-V_{fb}$. In at least one embodiment, summer 102 is a node of loop filter 106 connected to a parallel resistor array that received the input signal $V_{in}$ and feedback signal $f_b$, Loop filter 106 with a transfer function H(z) filters difference signal, $V_{diff}$, to shift quantization noise signals out of the baseband, e.g. 0 Hz to 20 kHz for audio applications. In one embodiment, filter 106 includes N, series connected integrators and a feedforward summer, where N is an integer greater than or equal to 1. A digital filter 110 processes the output signal Y to provide a multi-bit output at a lower rate than the operational rate of ADC delta sigma modulator 100 by filtering out out-of-band noise.

The quantizer 108 produces a quantization error E(z), which represents noise produced by the delta sigma modulator 100. The $N^{th}$ order delta sigma modulator output signal Y can be defined in terms of the input signal X(z), the error E(z), the STF, and the NTF as set forth in the z-domain Equation [1]:

$$Y(z)=STF(z) \cdot X(z)+NTF(z) \cdot E(z) \qquad [1].$$

Delta sigma modulators can be implemented using a vast array of configurations that are well discussed extensively in the literature such as *Delta Sigma Data Converters—Theory, Design, and Simulation*, Norsworthy, Schreier, and Temes, IEEE Press (1997) and *Understanding Delta-Sigma Data Converters*, Schreier and Temes, IEEE Press (2005).

FIG. 2 depicts a digital-to-analog converter (DAC) signal processing system 200 described in commonly assigned U.S. Pat. No. 6,727,832, entitled "Data Converters with Digitally Filtered Pulse Width Modulation Output Stages and Methods and Systems Using the Same", with the same inventor John L. Melanson. DAC signal processing system 200 converts an input signal 102 generated by source 104 into an output signal 106. The source 104 can be any data signal source such as a compact disk player, a digital versatile disk player, and other audio signal sources. The input signal 102 generally undergoes pre-processing by preprocessor 108. In an audio system context, in preparation for processing by delta sigma modulator 210, pre-processing generally involves over-sampling input signal 102. Thus, for an audio signal sampled at 48 kHz and an oversampling ration of 128:1, pre-processor 108 generates an input signal x(n) ("X(z)" in the z-domain) with a sampling frequency of 6.144 MHz.

The delta sigma modulator 200 includes an M-bit quantizer 212 that quantizes an output signal L(z) of loop filter 214 and generates an output signal Y(z). The delta sigma modulator 210 also has a signal transfer function (STF) and a noise transfer function (NTF) to process output signal $Y(z) \cdot z^{-1}$ and the input signal X(z). "$z^{-1}$" represents a delay of one clock cycle in the z-domain. The output signal Y(z) generally relates to the input signal X(z) and quantization error E(z) in accordance with Equation [1], which is reproduced below for convenience:

$$Y(z)=STF(z) \cdot X(z)+NTF(z) \cdot E(z) \qquad [1].$$

Post-processor 216 includes pulse width modulator 218 and a low pass finite impulse response (FIR) filter 220 to drive out-of-band noise to a low level. In at least one embodiment, FIR filter 220 is a comb type filter or the convolution of two or more comb filters. At least one embodiment of the combination of a pulse width modulator 218 and FIR filter 512 is described in U.S. Pat. Nos. 6,727,832, 6,150,969, and 5,815,102, inventor John L. Melanson, which are hereby incorporated by reference in their entirety. In at least one embodiment, the transfer function of FIR filter 220 is designed as a low-pass filter to provide zeros at of out-of-band frequencies with non-trivial amplitudes. For example, in at least one embodiment, the transfer function of FIR filter 220 provides zeros at frequencies corresponding to operational frequencies and corresponding harmonic frequencies of the pulse width modulator 218. The combination of pulse width modulator 218 and FIR filter 220 produces an output signal 116 with high accuracy and low out-of-band noise. Thus, the output signal 116 exhibits low sensitivity to jitter and to convolution with system noise.

The inventor has determined that it would be desirable to include the filtering capabilities of the pulse width modulator 218 and FIR filter 220 combination in the feedback loop of an ADC delta sigma modulator to filter the output signal of DAC 104. However, many features of digital-to-analog converter (DAC) delta sigma modulators do not necessarily translate well into analog-to-digital converter delta sigma modulator. For example, the pulse width modulator 218 and FIR filter 220 combination include delays, such as delays caused by the length of the response of pulse width modulator 218 and delays inherent in FIR filter 220. Such delays can cause an ADC delta sigma modulator to become unstable.

SUMMARY OF THE INVENTION

In one embodiment of the present invention, a signal processing system includes an analog-to-digital converter. The analog-to-digital converter includes a main loop filter having a transfer function $H_{MAIN}$. The main loop filter includes a signal input to receive an input signal, a quantizer, and a first digital-to-analog converter coupled to an output of the quantizer, the first digital-to-analog converter comprising a duty cycle modulator. The main loop filter also includes a finite impulse response filter coupled to an output of the first digital-to-analog converter and an integrator coupled to the signal input, to an output of the finite impulse response filter, and to an input of the quantizer. The analog-to-digital converter also includes a stabilizer loop coupled to an output of the quantizer and an input to the quantizer, the stabilizer loop having a transfer function $H_{ST}$, wherein a target transfer function of the analog-to-digital converter is $H_T$, and $H_T$ comprises a combination of $H_{MAIN}$ and $H_{ST}$.

In another embodiment of the present invention, a signal processing system includes an analog-to-digital converter having a target transfer function of $H_T$. The analog-to-digital converter includes a delta sigma modulator. The delta sigma modulator includes a main loop filter to process input data and quantization feedback data in accordance with a transfer function $H_{MAIN}$. The main loop filter includes components for receiving the input data, generating the quantization feedback data from quantizer output data using (i) pulse width modulation to generate pulse width modulated output data and (ii) finite impulse response filtering of the pulse width modulated output data, combining the input signal with the quantization feedback data to generate an input_feedback signal, and processing the input_feedback signal using at least one integrator. The delta sigma modulator also includes a stabilizer loop to process the quantizer output data in accordance with a transfer function $H_{ST}$, wherein the target transfer function $H_T$ comprises a combination of $H_{MAIN}$ and $H_{ST}$.

In a further embodiment of the present invention, a method for converting an analog input signal into a digital signal includes converting the analog input signal into a digital output signal using a delta sigma modulator having a target transfer function $H_T$, wherein the delta sigma modulator includes a main loop having a transfer function $H_{MAIN}$ and a stabilizer loop having a transfer function $H_{ST}$. The target transfer function $H_T$ includes a combination of $H_{MAIN}$ and $H_{ST}$. Converting the analog input signal includes determining a first signal from the analog input signal using a main loop of a delta sigma modulator, wherein the main loop includes (i) a quantizer feedback path comprising a duty cycle modulator coupled to a first finite impulse response filter and (ii) a signal path comprising an integrator. Converting the analog input signal further includes determining a stabilizer signal using a stabilizer loop of the delta sigma modulator, wherein the stabilizer loop is coupled across a quantizer of the delta sigma modulator and the stabilizer loop includes a digital-to-analog converter coupled to a second finite impulse response filter, generating a quantizer input signal from the first signal and the stabilizer signal, and quantizing the quantizer input signal.

In another embodiment of the present invention, a method for converting an analog signal into a digital signal includes receiving an input signal and processing the input signal using delta sigma modulation in accordance with a target transfer function $H_T$. The target transfer function $H_T$ is a function of a main loop transfer function $H_{MAIN}$ and a stabilizer loop transfer function $H_{ST}$. Processing the input signal using delta sigma modulation in accordance with a target transfer function $H_T$ further includes in a main loop of the delta sigma modulator:

generating quantization feedback data from quantizer output data, wherein generating quantization feedback data from quantizer output data comprises:
  duty cycle modulating quantizer output data to generate pulse width modulated output data; and
  filtering the pulse width modulated output data with finite impulse response filter;
combining the input signal with the quantization feedback data to generate an input_feedback signal; and
processing the input_feedback signal using at least one integrator to generate a main loop output signal;

and includes in a stabilizer loop of the delta sigma modulator:

processing the quantizer output data to generate a stabilizer feedback signal using a digital-to-analog converter combining the input signal with the quantization feedback data to generate an input_feedback signal; and Processing the input signal using delta sigma modulation in accordance with a target transfer function $H_T$ also includes combining the main loop output signal and the stabilizer feedback signal to generate a main loop_stabilizer signal and generating a quantization output signal using the main loop_stabilizer signal.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A signal processing system includes an analog-to-digital delta sigma modulator with a duty cycle modulator and a finite impulse response (FIR) filter in a main loop feedback path of the delta sigma modulator. The duty cycle modulator and FIR filter can provide high performance filtering in the main loop feedback path. To prevent instability in the main loop caused by the duty cycle modulator and FIR filter, the delta sigma modulator also includes a stabilizer loop. Transfer functions of the main loop and the stabilizer loop combine to achieve a target transfer function for the analog-to-digital delta sigma modulator that provides for stable operation of the analog-to-digital delta sigma modulator.

Figure 1:
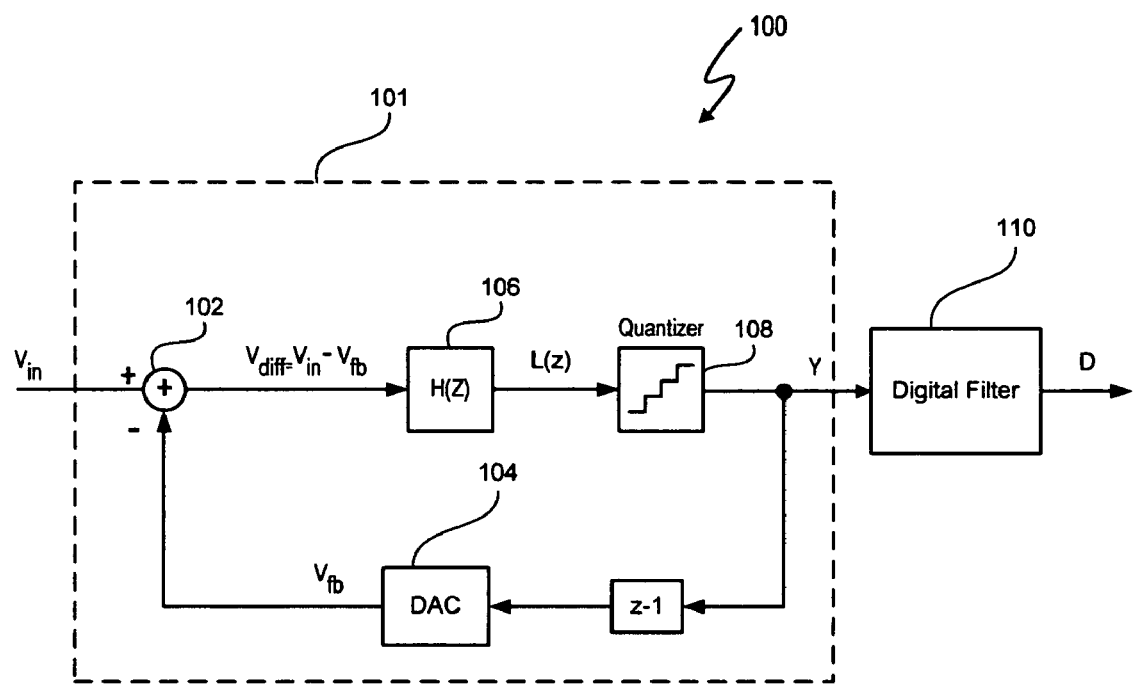
FIG. 1 (prior art) depicts an analog-to-digital delta sigma modulator.
Figure 2:
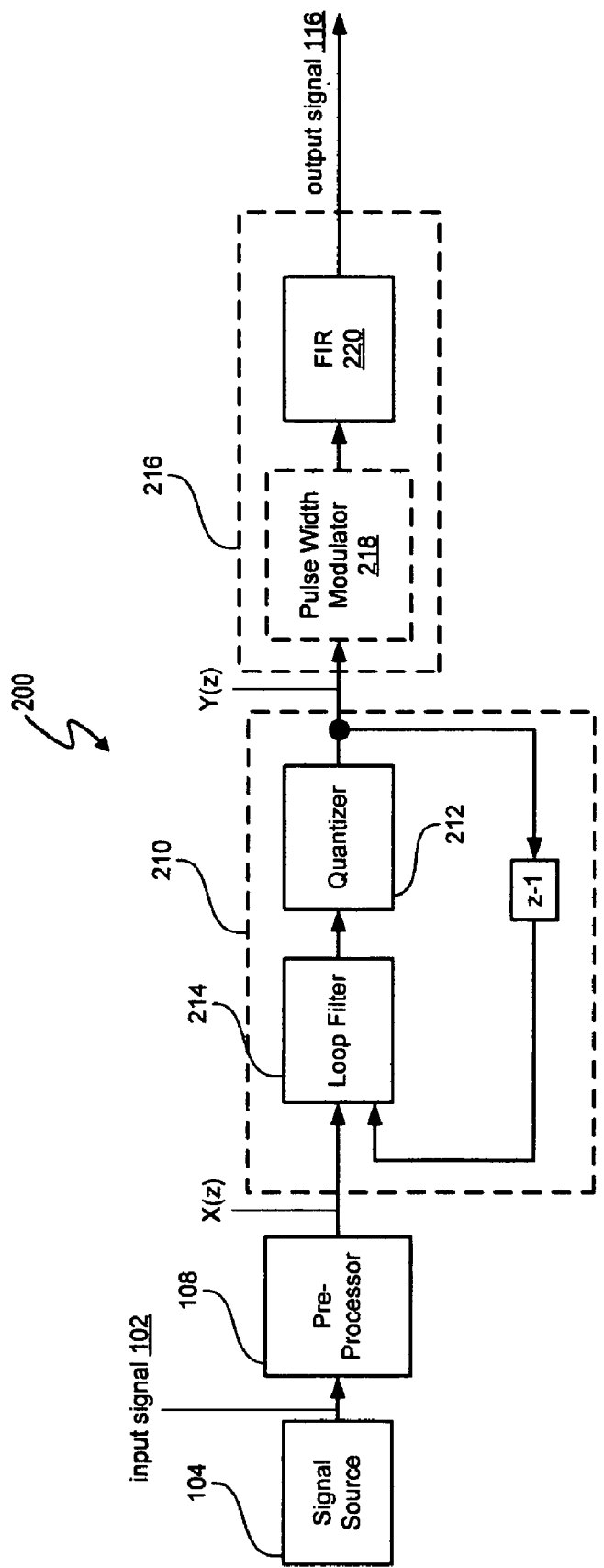
FIG. 2 (prior art) depicts a digital-to-analog delta sigma modulator signal processing system with a pulse width modulator and FIR filter post-processing filtering combination.
Figure 3:
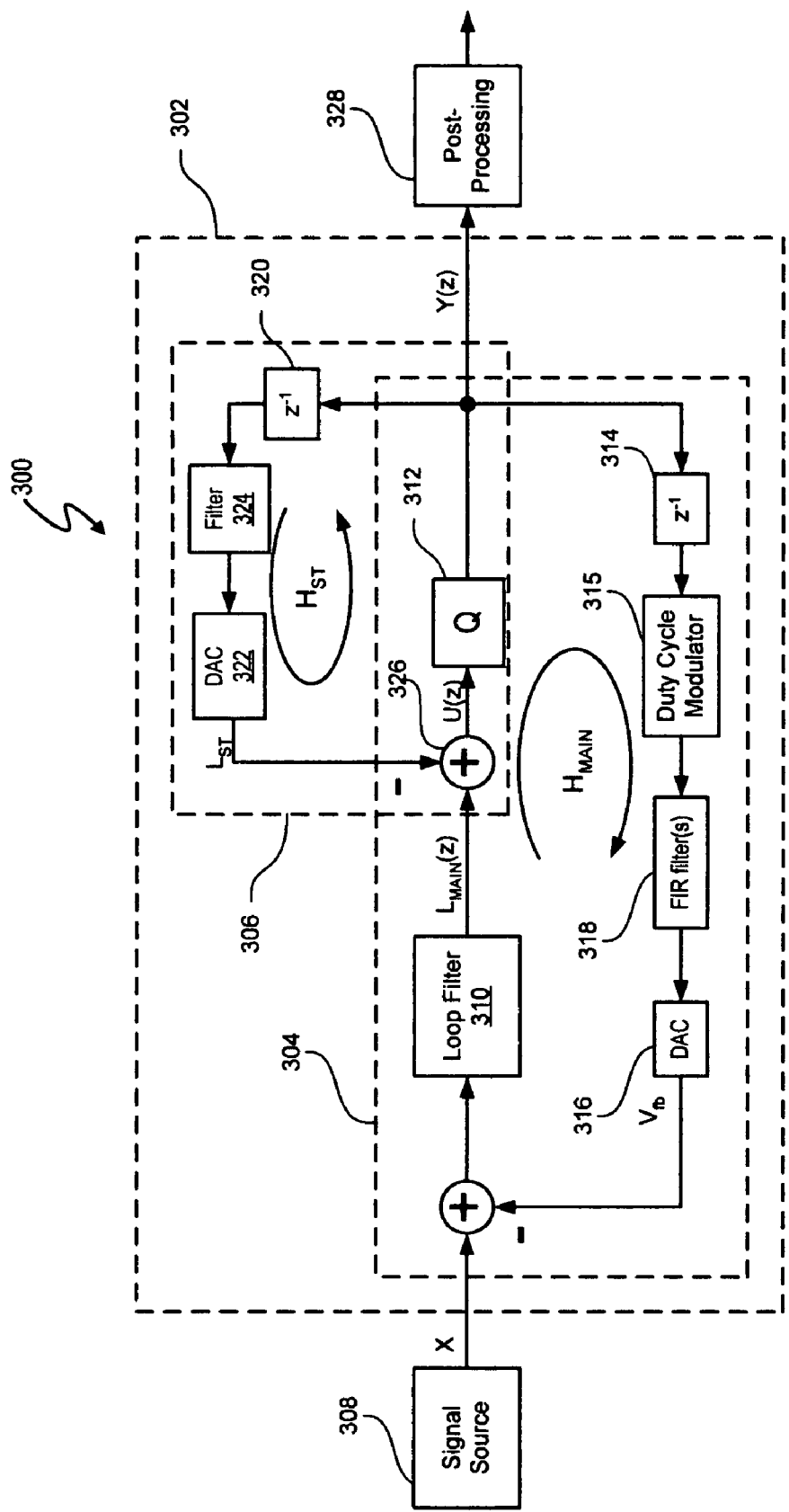
FIG. 3 depicts a signal processing system with an analog-to-digital delta sigma modulator having a main loop and a stabilizer loop.

FIG. 3 depicts a signal processing system 300 with an analog-to-digital delta sigma modulator 302 having a main loop 304 and a stabilizer loop 306. Signal source 308 can be any analog signal source such as a microphone. In at least one embodiment, signal source 308 provides the input signal as a varying voltage. The delta sigma modulator input signal X(z) is oversampled at a frequency that exceeds the signal band Nyquist frequency. For audio input signals, in-band frequencies are generally 0 Hz to 20 kHz. Various sampling frequencies and oversampling ratios can be used. In at least one embodiment, for an oversampling ratio of 128:1 and a sampling frequency $f_s$ equal 48 kHz, delta sigma modulator 302 operates at a clock frequency of 6.144 MHz.

Loop filter 310 provides noise shaping for delta sigma modulator 302 by moving significant amounts of in-band noise energy present in the feedback signal $V_{fb}$ into out-of-band frequencies. The implementation of loop filter 310 is a matter of design choice and depends in part on the desired noise shaping properties of delta sigma modulator 302. An embodiment of loop filter 310 is subsequently described in more detail.

Delta sigma modulator 302 generates the feedback signal $V_{fb}$ from an output signal Y(z) of quantizer 312. Quantizer 312 represents an M-bit quantizer, where "M" is an integer greater than zero and represents the number of bits used by quantizer 108 to quantize the output signal L(z) of loop filter 106. Quantizer 312 generates a series of low resolution pulses having an average amplitude over time proportional to the sampled input signal X(z). The quantizer output signal Y(z) is fed back via a one clock cycle delay $z^{-1}$ 314 to a duty cycle modulator 315. In one embodiment, the duty cycle modulator 315 is a pulse width modulator. FIR filter(s) filters the duty cycle modulator 315 output. In one embodiment, the FIR filter(s) 318 is one (1) FIR filter implemented as a "boxcar" filter (also referred to as a "comb" filter from a frequency-domain perspective). In another embodiment, FIR filter(s) 318 is a "triangle" filter, e.g. the convolution of two (2) boxcar filters of the same or different order. The duty cycle modulator 315, FIR filter(s) 318, and DAC 316 filter(s) 318 converts the signal $Y(z) \cdot z^{-1}$ ("y(n−1)" in the time domain) into an analog signal. $V_{fb}$ with high accuracy and highly attenuated energy in out-of-band frequencies.

Duty cycle modulator 315 and FIR filter(s) 318 introduce delays in the feedback path of main loop 304 that result in insufficient out-of-band frequency gain, which can cause instability in a conventional ADC delta sigma modulator and inadequate noise shaping. The primary source of delay arises from the inherent delays of FIR filter(s) 318. Another source of delay is the length of the response of pulse width modulator 218 filter(s) 318

The main loop transfer function H includes a noise transfer function (NTF) and a signal transfer function (STF). Ideally, the NTF of delta sigma modulator 302 in the z-domain ("NTF(z)") is represented by Equation [2]:

$$NTF = \frac{1}{1 - z^{-1} \cdot H_{MAIN}}, \qquad [2]$$

However, Equation [2] does not hold true with duty cycle modulator 315 and FIR filter(s) 318 in the feedback path of main loop 304.

In at least one embodiment, the delta sigma modulator 302 includes a stabilizer loop 306 having a transfer function $H_{ST}$ to achieve a target NTF represented by Equation [3]:

$$NTF = \frac{1}{1 - z^{-1} \cdot H_T}, \qquad [3]$$

where $H_T$ is a target transfer function related to the main loop transfer function $H_{MAIN}$ and stabilizer loop transfer function $H_{ST}$ in accordance with Equation [4]:

$$H_T = H_{MAIN} + H_{ST} \qquad [4].$$

Stabilizer loop 306 provides gain for out-of-band frequencies in the NTF of delta sigma modulator 302 to compensate of the insufficient out-of-band frequency gain of transfer function $H_{MAIN}$. Thus, stabilizer loop 306 allows delta sigma modulator 302 to implement the desirable filtering characteristics of DAC 316 and FIR filter(s) 318 and remain stable during operation. The stabilizer loop 302 operates in parallel with the main loop 304. The quantizer output signal Y(z) is fed back through a one clock cycle delay $z^{-1}$ 320 to DAC 322. In at least one embodiment, DAC 322 is a conventional digital-to-analog converter. Filter 324 filters $Y(z) \cdot z^{-1}$, and DAC 316 converts the output of filter 324 into analog signal $L_{ST}$. Combining node 326 combines the output signal $L_{MAIN}$(z) of loop filter 310 with the output signal $L_{ST}$ of DAC 322. In one embodiment, the polarity of output signals $L_{MAIN}(z)$ and $L_{ST}$ are such that combining node 326 sums output signals $L_{MAIN}(z)$ and $-L_{ST}$ to generate quantizer input signal U(z). Post-processor 328 further processes the quantizer output signal Y(z) to produce a digital signal in a desired format. Post-processor 328 generally includes a digital filter to provide a multi-bit output at a lower rate than the operational rate of ADC delta sigma modulator 302. In at least one other embodiment, the stabilizer loop 306 generates a digital output signal $L_{ST}$ or a combination analog and digital signal such that output signal $L_{ST}$ provides stability to delta sigma modulator 302. Additionally, the stabilizer loop 306 can be implemented after quantizer 312 or before and after quantizer 312 to provide stability to delta sigma modulator 302.

Figure 4:
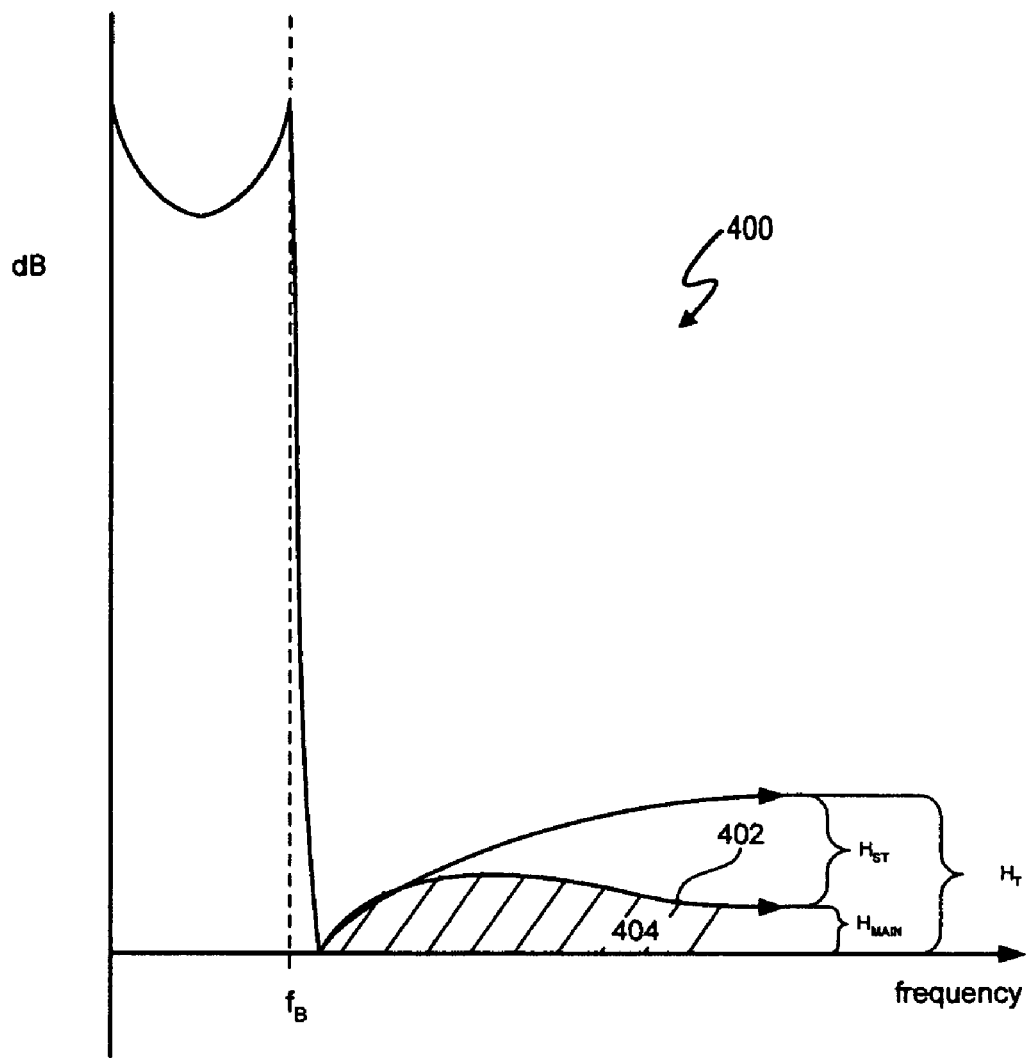
FIG. 4 depicts a frequency response of a target transfer function as a function of a main loop transfer function and a stabilizer loop transfer function.

FIG. 4 graphically depicts the frequency response 400 of the target transfer function $H_T$ as a function of main loop transfer function $H_{MAIN}$ and stabilizer loop transfer function $H_{ST}$. In at least one embodiment, the transfer function $H_{MAIN}$ has infinite gain at 0 Hz and high in-band gain, and the gain falls off sharply at the baseband frequency, $f_b$, e.g. 20 kHz. As indicated by the cross-hatched region 404, the frequency response 402 of transfer function $H_{MAIN}$ provides relatively small gain in the out-of-band frequencies, i.e. the frequencies about the baseband frequency fb. In an audio context, the baseband frequency fb is approximately 20 kHz. The stabilizer loop transfer function $H_{ST}$ compensates for the low out-of-band frequency gain of main loop transfer function H by having a higher gain in the out-of-band frequency region. The linear combination of transfer functions $H_{MAIN}$ and $H_{ST}$ achieve the target transfer function $H_T$ as, for example, indicated in Equation [4].

Figure 5:
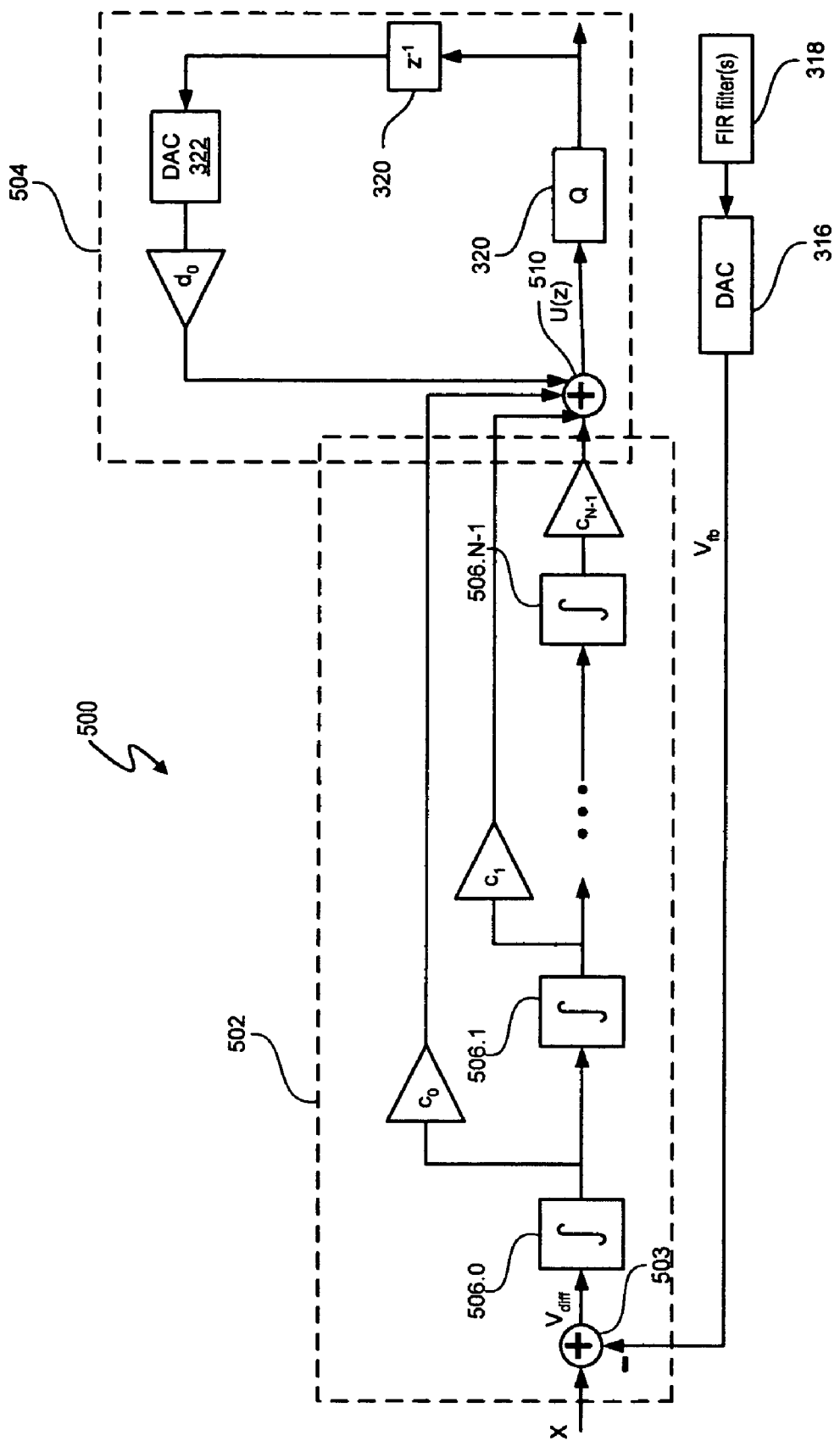
FIG. 5 depicts a main loop filter and stabilizer filter for the analog-to-digital delta sigma modulator of FIG. 3.

FIG. 5 depicts loop filter 502 and stabilizer loop 504, which represent respective embodiments of main loop filter 310 and stabilizer loop filter 306. The loop filter 502 includes 5 integrators 506.0, 506.1, . . . , 506.N−1, where N is an integer and represents the order of the loop filter 502. Filter coefficients $c_i$ to obtain a desired STF and NTF can be, for example, included in the feedback loop. The feedback signal $V_{fb}$ is fed back to summer 503 and combined with analog input signal X to produce a difference signal $V_{diff}$. Integrator 204.0 integrates the difference signal $V_{diff}$. Integrators 204.1 and 204.N−1 integrate an output of the respective previous integrator 204.0 and 204.N−2. The main loop 502 also includes one or more feed forward coefficients, $c_0$, $c_1$, . . . , $c_{N-1}$ that adjust the main loop transfer function $H_{MAIN}$ to achieve a close approximation of the target transfer function $H_T$. The determination of the value of coefficients, $c_0, c_1, \ldots, c_{N-1}$ is subsequently described in more detail.

The stabilizer loop 504 includes a DAC 322 to convert $Y(z) \cdot z^{-1}$ into an analog signal. In at least one embodiment, DAC 322 is a pulse width modulator. In at least one embodiment, filter 324 is a $1^{st}$ order filter that can be represented by a gain $d_0$. The value of gain $d_0$ is established to allow the stabilizer loop 504 to provide out-of-band compensating gain to achieve the target transfer function $H_T$. In at least one embodiment, the main loop filter output signal $L_{MAIN}(z)$ and output signal $L_{ST}(Z)$ of filter 324 are summed by summing node 510.

Figure 6:
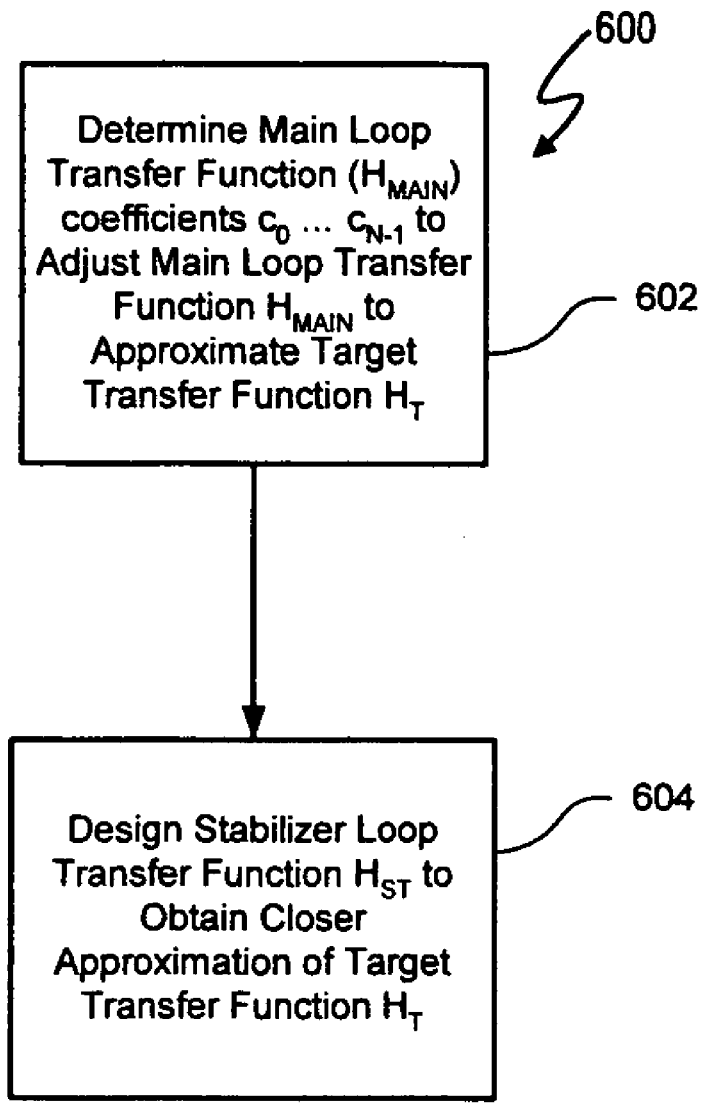
FIG. 6 depicts an analog-to-digital delta sigma modulator main loop and stabilizer loop design process.

Referring to FIGS. 3, 5, and 6, FIG. 6 depicts an analog-to-digital delta sigma modulator main loop and stabilizer loop design process 600. The design process 600 applies to main loop 304 stabilizer loop 302 but is described in the context of main loop 502 and stabilizer loop 504. Operation 602 determines the main loop transfer function $H_{MAIN}$ by, for example, determining the impulse response of each integrator 506.0 through 506.N−1 and adjusting the coefficients of $c_0$ through $c_{N-1}$ to obtain a STF and NTF that is a close approximation of a target STF and NTF.

Operation 602 adjusts the main loop transfer function $H_{MAIN}$ to approximate the target transfer function $H_T$. The characteristics of DAC 316 and FIR filter(s) 318 prevent the transfer function $H_{MAIN}$ from exactly matching the target transfer function $H_T$. However, in at least one embodiment, the coefficients, $c_0, c_1, \ldots, c_{N-1}$ are chosen so that the impulse response of $H_{MAIN}$ approximates as closely as possible the impulse response of $H_T$ for t>n1, where n1 is the length of a comb FIR filter 502.

Figure 7:
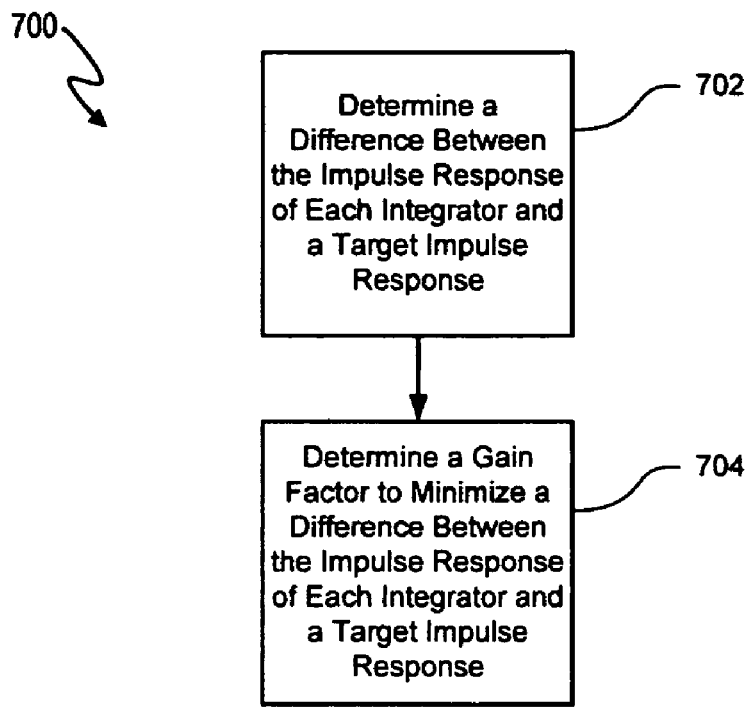
FIG. 7 depicts a main loop adjustment operation.

FIG. 7 depicts a main loop adjustment operation 700 that represents one embodiment of operation 602. Main loop adjustment operation 700 is discussed with reference to loop filter 502. Operation 702 determines respective differences between the impulse response of each integrator 506.0 through 506.N−1 and target impulse responses of target transfer function $H_T$. Operation 704 determines a gain factor go to minimize the difference between the impulse response of each integrator 506.0 through 506.N−1 and target impulse responses of target transfer function $H_T$.

Referring to FIG. 6, operation 604 designs the stabilizer loop transfer function $H_{ST}$ so that the combination of transfer function $H_{MAIN}$ and $H_{ST}$ closely approximates or, preferably, exactly matches the target transfer function $H_T$.

Figure 8:
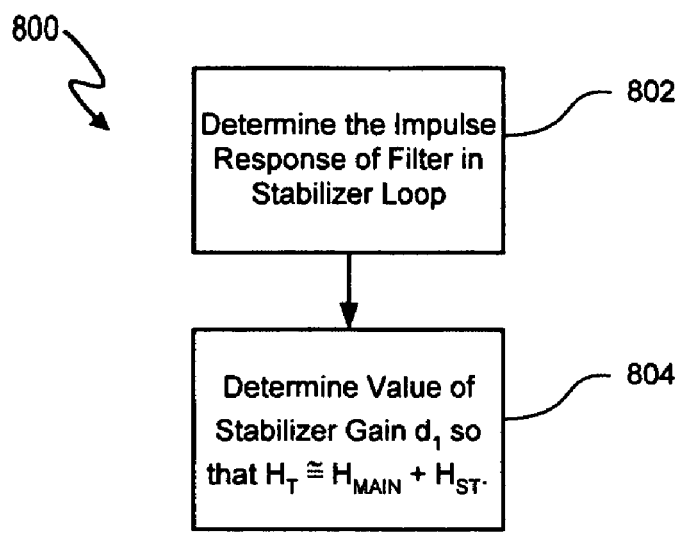
FIG. 8 depicts a stabilizer loop adjustment operation

FIG. 8 depicts a stabilizer loop adjustment operation 800 that represents one embodiment of operation 606. Stabilizer loop adjustment operation 800 is discussed with reference to stabilizer loop 504. Operation 802 determines the impulse response of filter 324. For stabilizer loop 504, the impulse response is the gain $d_0$. Operation 804 determines the value of gain $d_0$ so that the sum of the impulse response of stabilizer 504 and the impulse response of loop filter 502 closely approximates or, preferably, exactly matches the target transfer function $H_T$.

Figure 9:
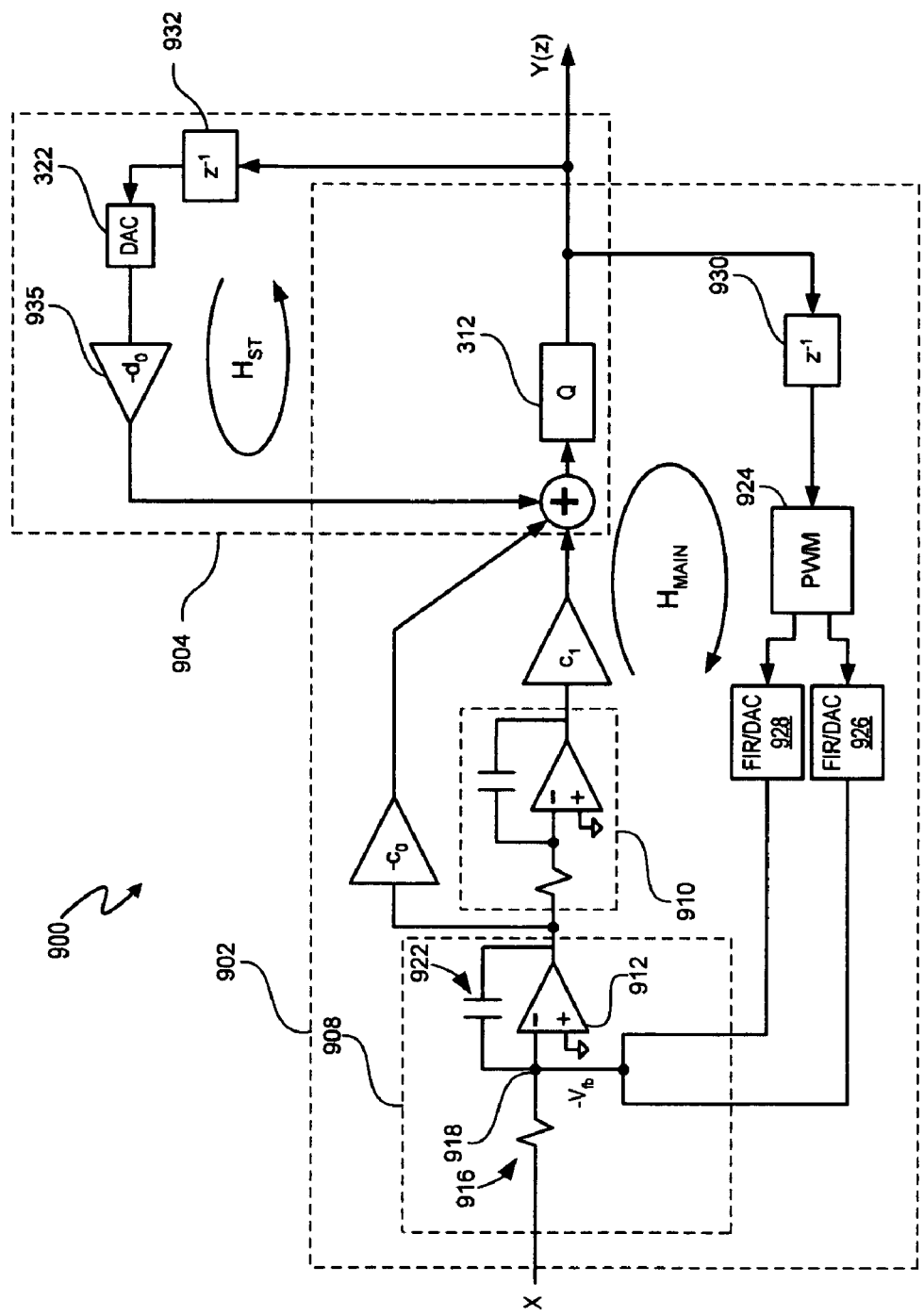
FIG. 9 depicts a second order analog-to-digital delta sigma modulator having a main loop and a stabilizer loop.

FIG. 9 depicts a second order analog-to-digital delta sigma modulator 900 having a main loop 902 and a stabilizer loop 904. Delta sigma modulator 900 represents one embodiment of delta sigma modulator 302. Loop filter 906 is a $2^{nd}$ order filter with two integrators 908 and 910. Summing node 918 sums the analog input signal X and analog output signals of FIR/DAC 926 and FIR/DAC 928. Integrator 908 includes an operational-amplifier 912 configured as an integrator by feedback capacitor 922, resistor 916, and resistor arrays (or e.g. current source arrays) (see FIG. 10) of FIR/DAC 926 and FIR/DAC 928. Generally, each tap of FIR/DAC 926 and FIR/DAC 928 is connected to a respective resistor or current source. Integrator 910 is configured like integrator 908 to integrate the output of integrator 908. The 3-state pulse width modulator 924 provides respective output signals to FIR/DAC 926 and FIR/DAC 928. In at least one embodiment, the pulse width modulator 924 is implemented with a variable pulse width of 0 to 8. The combination of pulse width modulator 924 and FIR/DAC 926 and FIR/DAC 928 provide superb attenuation of out-of-band energy. At least one embodiment of 3-state pulse width modulator 924 is described in commonly assigned U.S. Pat. No. 6,885,330, which is hereby incorporated by reference in it entirety. Delays 930 and 932 can be implemented by a latch that delays quantizer output signal Y(z) by one clock cycle. Filter 935 is a $1^{st}$ order FIR filter.

Figure 10:
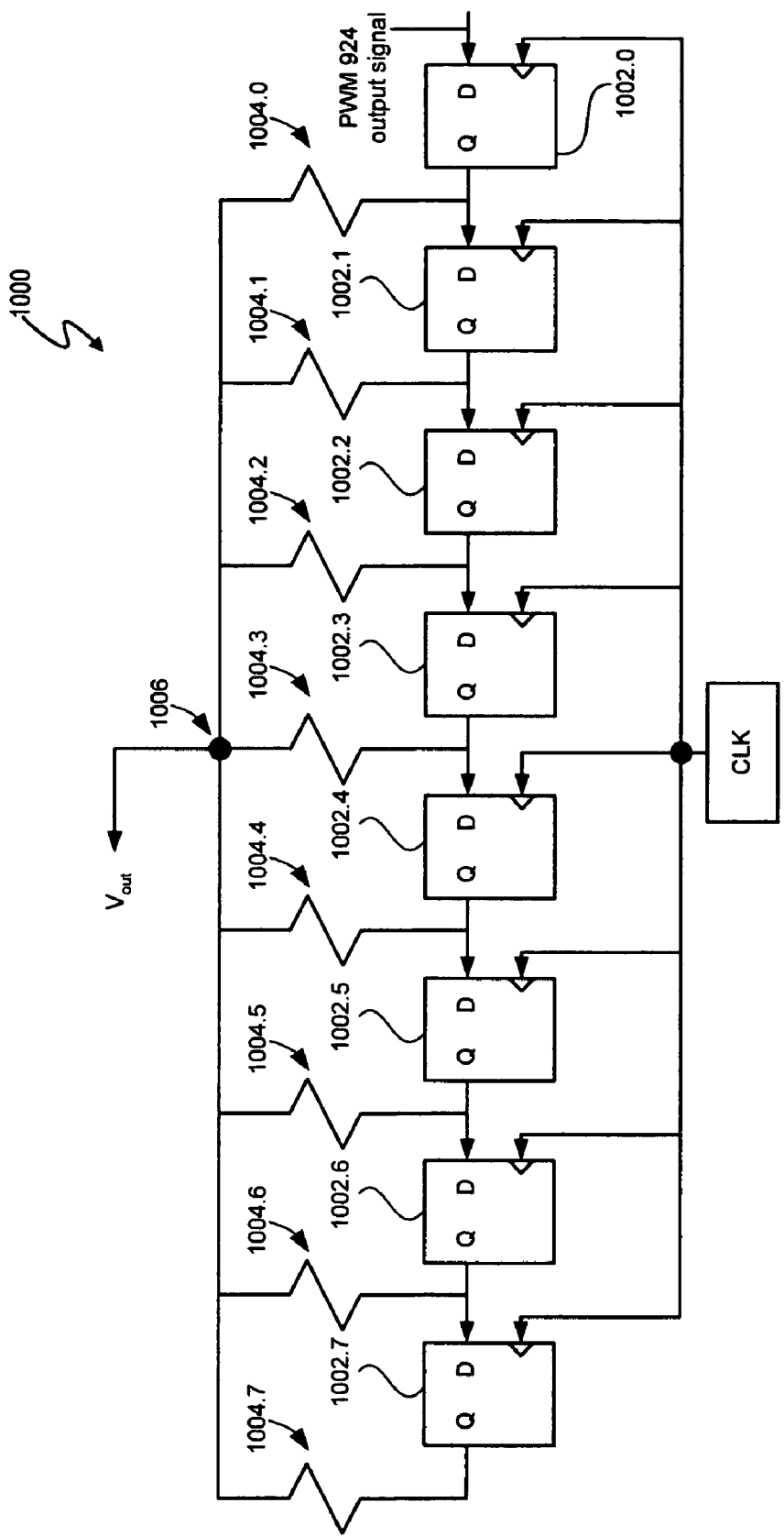
FIG. 10 depicts an 8-tap FIR filter and digital-to-analog converter from an ADC delta sigma modulator main loop feedback path.

FIG. 10 depicts s an 8-tap FIR filter/digital-to-analog converter 1000, which represents one embodiment of FIR/DAC 926 and one embodiment of FIR/DAC 928. The FIR filter/digital-to-analog converter 1000 includes 8 series connected D-flip-flops 1002.0, 1002.1, . . . , 1002.7 so that the output Q or flip-flops 1002.0 . . . 1002.6 is connected to the respective D input of flip-flops 1002.1 . . . , 1002.7. The output signal of pulse width modulator 924 provides the input signal to the D input of flip-flop 1002.0. The flip-flops are clocked by a clock signal CLK having a frequency of 8 times the sampling frequency of delta sigma modulator 900. The clock signal CLK also provides the operating clock for pulse width modulator 924. The DAC portion of at least one embodiment of FIR/DAC 926 and FIR/DAC 928 is implemented by a parallel coupled resistor array of resistors 1004.0, 1004.1, . . . , 1004.7 coupled to the Q outputs of respective flip-flops 1002.0, 1002.1, . . . , 1002.7 and a common output node 1006. The output signal $V_{out}$ of FIR/DAC 926 and FIR/DAC 928 are combined with the input signal X in FIG. 9 to form the difference signal $V_{diff}$ input to operational-amplifier 912.

Referring to FIGS. 6, 7, 8, and 9, the following is an example description of the determination of coefficient values $-c_0$ and $c_1$ that allow delta sigma modulator 900 to obtain a target transfer function $H_T$. In one embodiment, the target transfer function of the second order delta sigma modulator 900 is:

$$H_T(z) = H_1(z) + H_2(z) = \frac{1}{(1-z^{-1})^2} + \frac{1}{1-z^{-1}}$$

so that $$NTF = \frac{1}{1 - z^{-1} \cdot H_T} = (1 - z^{-1})^2.$$

The target transfer function $H_T$ has an impulse response of vector:

$RES_{HT}=[2, 3, 4, 5, \ldots]$.

Without $-c_0$ and $c_1$ set to 1, operation 602 determines the impulse response of integrator 908 to be the vector:

$RES_{908}=[0.5625, 1, 1, 1, \ldots]$.

and the impulse response of integrator 910 to be the vector:

$RES_{910}=[0.199219, 1.0625, 2.0625, 3.0625, \ldots]$.

The main loop transfer function $H_{MAIN}(z)$ impulse response vector:

$RES_{HMAIN}=-c_0 \cdot RES_{908}+c_1 \cdot RES_{910}$.

With $c_0=c_1=1$, the impulse response of $H_{MAIN}(z)$, is:

$RES_{HMAIN}=[0.761719, 2.0625, 3.0625, 4.0625, \ldots]$.

From operation 702:

$RES_{HT}-RES_{HMAIN}=[1.238281, 0.9375, 0.9375, 0.9375, \ldots]$.

Operation 704 determines that if $c_0=1.9375$, then:

$RES_{HMAIN}=[1.289, 3, 4, 5, \ldots]$.

Operation 802 determines that the impulse response of stabilizer loop 904 to be the vector:

$RES_{ST}=[d_0, 0, 0, 0, \ldots]$.

Operation 804 sets $d_0=0.75$ so that:

$RES_{HMAIN}+RES_{ST}=[1.289, 3, 4, 5, \ldots]+[0.75, 0, 0, 0, \ldots]=[2.039, 3, 4, 5, \ldots]$, which closely approximates the target transfer function $H_T$ impulse response.

Thus, to prevent instability in the main loop 304 caused by the DAC 316 and FIR filter 318 in the feedback path of main loop 304, the delta sigma modulator 302 includes a stabilizer loop 306. Transfer functions $H_{MAIN}$ and $H_{ST}$ of the respective main loop 304 and the stabilizer loop 306 combine to achieve a target transfer function $H_T$ for the analog-to-digital delta sigma modulator 302 that provides for stable operation of the analog-to-digital delta sigma modulator 302.

Although the present invention has been described in detail, it should be understood that various changes, substitutions and alterations can be made hereto without departing from the spirit and scope of the invention as defined by the appended claims.

What is claimed is:

1. A signal processing system comprising an analog-to-digital converter, the analog-to-digital converter comprising:
   a main loop filter having a transfer function $H_{MAIN}$, the main loop filter comprising:
      a signal input to receive an input signal;
      a quantizer;
      a first digital-to-analog converter coupled to an output of the quantizer, the first digital-to-analog converter comprising a duty cycle modulator;
      a finite impulse response filter coupled to an output of the first digital-to-analog converter;
      an integrator coupled to the signal input, to an output of the finite impulse response filter, and to an input of the quantizer; and
   a stabilizer loop coupled to an output of the quantizer and an input to the quantizer, the stabilizer loop having a transfer function $H_{ST}$;
   wherein a target transfer function of the analog-to-digital converter is $H_T$, and $H_T$ comprises a combination of $H_{MAIN}$ and $H_{ST}$.

2. The signal processing system of claim 1 wherein the combination of $H_{MAIN}$ and $H_{ST}$ comprises $H_{MAIN}+H_{ST}$.

3. The signal processing system of claim 1 wherein the stabilizer loop comprises:
   a second digital-to-analog converter; and
   a finite impulse response filter coupled to an output of the second digital-to-analog converter.

4. The signal processing system of claim 1 comprising:
   a first summing component coupled between the integrator and the input to the quantizer and coupled to an output of the stabilizer loop.

5. The signal processing system of claim 1 wherein the duty cycle modulator comprises a pulse width modulator.

6. The signal processing system of claim 1 wherein the target transfer function $H_T$ includes a noise transfer function and a signal transfer function, and the noise transfer function (NTF) has the general form of:

$$NTF = \frac{1}{1 - z^{-1} \cdot H_T}.$$

7. The signal processing system of claim 1 wherein the input signal comprises an audio signal.

8. The signal processing system of claim 1 wherein the delta sigma modulator and filter are implemented using code stored in a memory and executable by a processor.

9. A signal processing system comprising an analog-to-digital converter having a target transfer function of $H_T$, the analog-to-digital converter comprising:
   a delta sigma modulator comprising:
      a main loop filter to process input data and quantization feedback data in accordance with a transfer function $H_{MAIN}$, wherein the main loop filter comprises components for:
         receiving the input data;
         generating the quantization feedback data from quantizer output data using (i) pulse width modulation to generate pulse width modulated output data and (ii) finite impulse response filtering of the pulse width modulated output data;

combining the input signal with the quantization feedback data to generate an input_feedback signal; and processing the input_feedback signal using at least one integrator; and a stabilizer loop to process the quantizer output data in accordance with a transfer function $H_{ST}$;

wherein the target transfer function $H_T$ comprises a combination of $H_{MAIN}$ and $H_{ST}$.

10. The signal processing system of claim 9 wherein the combination of $H_{MAIN}$ and $H_{ST}$ comprises $H_{MAIN}+H_{ST}$.

11. The signal processing system of claim 9 wherein the stabilizer loop comprises components for:

converting the quantizer output data from digital data to analog data; and filtering the analog data to provide high frequency gain in a noise transfer function of the main loop filter.

12. The signal processing system of claim 9 wherein the input data comprises an audio signal.

13. The signal processing system of claim 9 wherein the target transfer function $H_T$ includes a noise transfer function and a signal transfer function, and the noise transfer function (NTF) has the general form of:

$$NTF = \frac{1}{1 - z^{-1} \cdot H_T}.$$

14. The signal processing system of claim 9 wherein the delta sigma modulator and filter are implemented using code stored in a memory and executable by a processor.

15. The signal processing system of claim 9 wherein the component for combining the input signal with the quantization feedback data to generate an input_feedback signal comprises a component for determining a difference between the quantization feedback data and the input_feedback signal.

16. A method for converting an analog input signal into a digital signal, the method comprising:

converting the analog input signal into a digital output signal using a delta sigma modulator having a target transfer function $H_T$, wherein the delta sigma modulator includes a main loop having a transfer function $H_{MAIN}$ and a stabilizer loop having a transfer function $H_{ST}$, and the target transfer function $H_T$ comprises a combination of $H_{MAIN}$ and $H_{ST}$;

wherein converting the analog input signal comprises:

determining a first signal from the analog input signal using a main loop of a delta sigma modulator, wherein the main loop includes (i) a quantizer feedback path comprising a duty cycle modulator coupled to a first finite impulse response filter and (ii) a signal path comprising an integrator;

determining a stabilizer signal using a stabilizer loop of the delta sigma modulator, wherein the stabilizer loop is coupled across a quantizer of the delta sigma modulator and the stabilizer loop includes a digital-to-analog converter coupled to a second finite impulse response filter;

generating a quantizer input signal from the first signal and the stabilizer signal; and quantizing the quantizer input signal.

17. The method of claim 16 wherein the combination of $H_{MAIN}$ and $H_{ST}$ comprises $H_{MAIN}+H_{ST}$.

18. A method for converting an analog signal into a digital signal, the method comprising:

receiving an input signal;

processing the input signal using delta sigma modulation in accordance with a target transfer function $H_T$, wherein the target transfer function $H_T$ is a function of a main loop transfer function $H_{MAIN}$ and a stabilizer loop transfer function $H_{ST}$, wherein processing the input signal using delta sigma modulation in accordance with a target transfer function $H_T$ further comprises:

in a main loop of the delta sigma modulator:

generating quantization feedback data from quantizer output data, wherein generating quantization feedback data from quantizer output data comprises:

duty cycle modulating quantizer output data to generate pulse width modulated output data; and filtering the pulse width modulated output data with finite impulse response filter;

combining the input signal with the quantization feedback data to generate an input_feedback signal; and processing the input_feedback signal using at least one integrator to generate a main loop output signal;

in a stabilizer loop of the delta sigma modulator:

processing the quantizer output data to generate a stabilizer feedback signal using a digital-to-analog converter; and combining the main loop output signal and the stabilizer feedback signal to generate a main loop_stabilizer signal; and generating a quantization output signal using the main loop_stabilizer signal.

19. The method of claim 18 wherein combining the main loop output signal and the stabilizer feedback signal comprises adding the main loop output signal and the stabilizer feedback signal.

20. The method of claim 18 wherein processing the quantizer output data to generate a stabilizer feedback signal using a digital-to-analog converter comprises:

converting the quantizer output data from digital data to analog data; and filtering the analog data to provide high frequency gain in a noise transfer function of the main loop filter.

21. The method of claim 18 wherein the input data comprises an audio signal.

* * * * *